(12) United States Patent  
Wang et al.

(10) Patent No.: US 8,450,191 B2
(45) Date of Patent: May 28, 2013

(54) POLYSILICON FILMS BY HDP-CVD

(75) Inventors: Anchuan Wang, San Jose, CA (US); Xiaolin Chen, San Ramon, CA (US); Young S. Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/089,966

(22) Filed: Apr. 19, 2011

(65) Prior Publication Data

US 2012/0190178 A1    Jul. 26, 2012

Related U.S. Application Data

(60) Provisional application No. 61/435,487, filed on Jan. 24, 2011.

(51) Int. Cl.
*H01L 21/20* (2006.01)
*H01L 21/3205* (2006.01)

(52) U.S. Cl.
USPC ........... 438/479; 438/478; 438/503; 438/505; 438/584; 438/680; 257/E21.09; 257/E21.294

(58) Field of Classification Search
USPC ...................... 438/479; 257/E21.09, E21.294
See application file for complete search history.

(56) References Cited

U.S. PATENT DOCUMENTS

| 4,147,571 A | 4/1979 | Stringfellow et al. |
|---|---|---|
| 4,200,666 A | 4/1980 | Reinberg |
| 4,816,098 A | 3/1989 | Davis et al. |
| 4,818,326 A | 4/1989 | Liu et al. |
| 4,910,043 A | 3/1990 | Freeman et al. |
| 4,931,354 A | 6/1990 | Wakino et al. |
| 4,946,593 A | 8/1990 | Pinigis |
| 5,016,332 A | 5/1991 | Reichelderfer et al. |
| 5,110,407 A | 5/1992 | Ono et al. |
| 5,212,119 A | 5/1993 | Hah et al. |
| 5,271,972 A | 12/1993 | Kwok et al. |
| 5,279,784 A | 1/1994 | Bender et al. |
| 5,393,708 A | 2/1995 | Hsia et al. |

(Continued)

FOREIGN PATENT DOCUMENTS

| DE | 19654737 A1 | 7/1997 |
|---|---|---|
| EP | 0892083 A1 | 1/1999 |

(Continued)

OTHER PUBLICATIONS

Aylett, B. J. at al., "Silicon-Nitrogen Compounds. Part V. Diphenylamino-derivatives of Silane," J. Chem. Soc. (A), 1969, pp. 636-638.

(Continued)

*Primary Examiner* — Angel Roman
(74) *Attorney, Agent, or Firm* — Kilpatrick Townsend & Stockton LLP

(57) ABSTRACT

Methods of forming polysilicon layers are described. The methods include forming a high-density plasma from a silicon precursor in a substrate processing region containing the deposition substrate. The described methods produce polycrystalline films at reduced substrate temperature (e.g. <500° C.) relative to prior art techniques. The availability of a bias plasma power adjustment further enables adjustment of conformality of the formed polysilicon layer. When dopants are included in the high density plasma, they may be incorporated into the polysilicon layer in such a way that they do not require a separate activation step.

16 Claims, 4 Drawing Sheets

U.S. PATENT DOCUMENTS

| | | | |
|---|---|---|---|
| 5,426,076 A | 6/1995 | Moghadam | |
| 5,434,109 A | 7/1995 | Geissler et al. | |
| 5,468,687 A | 11/1995 | Carl et al. | |
| 5,485,420 A | 1/1996 | Lage et al. | |
| 5,530,293 A | 6/1996 | Cohen et al. | |
| 5,547,703 A | 8/1996 | Camilletti et al. | |
| 5,558,717 A | 9/1996 | Zhao et al. | |
| 5,578,532 A | 11/1996 | van de Ven et al. | |
| 5,587,014 A | 12/1996 | Leychika et al. | |
| 5,593,741 A | 1/1997 | Ikeda | |
| 5,620,525 A | 4/1997 | van de Ven et al. | |
| 5,622,784 A | 4/1997 | Okaue et al. | |
| 5,635,409 A | 6/1997 | Moslehi | |
| 5,665,643 A | 9/1997 | Shin | |
| 5,691,009 A | 11/1997 | Sandhu | |
| 5,769,951 A | 6/1998 | van de Ven et al. | |
| 5,786,263 A | 7/1998 | Perera | |
| 5,811,325 A * | 9/1998 | Lin et al. | 438/159 |
| 5,843,233 A | 12/1998 | van de Ven et al. | |
| 5,853,607 A | 12/1998 | Zhao et al. | |
| 5,882,417 A | 3/1999 | van de Ven et al. | |
| 5,925,411 A | 7/1999 | van de Ven et al. | |
| 5,935,340 A | 8/1999 | Xia et al. | |
| 5,937,308 A | 8/1999 | Gardner et al. | |
| 5,937,323 A | 8/1999 | Orczyk et al. | |
| 6,008,515 A | 12/1999 | Hsia et al. | |
| 6,009,830 A | 1/2000 | Li et al. | |
| 6,014,979 A | 1/2000 | Van Autryve et al. | |
| 6,017,791 A | 1/2000 | Wang et al. | |
| 6,024,044 A | 2/2000 | Law et al. | |
| 6,087,243 A | 7/2000 | Wang | |
| 6,090,442 A | 7/2000 | Klaus et al. | |
| 6,090,723 A | 7/2000 | Thakur et al. | |
| 6,114,219 A | 9/2000 | Spikes et al. | |
| 6,121,130 A | 9/2000 | Chua et al. | |
| 6,140,242 A | 10/2000 | Oh et al. | |
| 6,146,970 A | 11/2000 | Witek et al. | |
| 6,150,286 A | 11/2000 | Sun et al. | |
| 6,156,394 A | 12/2000 | Yamasaki et al. | |
| 6,156,581 A | 12/2000 | Vaudo et al. | |
| 6,165,834 A | 12/2000 | Agarwal et al. | |
| 6,180,490 B1 | 1/2001 | Vassiliev et al. | |
| 6,187,682 B1 | 2/2001 | Denning et al. | |
| 6,191,004 B1 | 2/2001 | Hsiao | |
| 6,207,587 B1 | 3/2001 | Li et al. | |
| 6,258,690 B1 | 7/2001 | Zenke | |
| 6,287,962 B1 | 9/2001 | Lin | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,413,583 B1 | 7/2002 | Moghadam et al. | |
| 6,448,187 B2 | 9/2002 | Yau et al. | |
| 6,469,283 B1 | 10/2002 | Burkhart et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,548,899 B2 | 4/2003 | Ross | |
| 6,559,026 B1 | 5/2003 | Rossman et al. | |
| 6,566,278 B1 | 5/2003 | Harvey et al. | |
| 6,583,063 B1 | 6/2003 | Khan et al. | |
| 6,589,868 B2 | 7/2003 | Rossman | |
| 6,596,654 B1 | 7/2003 | Bayman et al. | |
| 6,599,839 B1 | 7/2003 | Gabriel et al. | |
| 6,602,806 B1 | 8/2003 | Xia et al. | |
| 6,614,181 B1 | 9/2003 | Harvey et al. | |
| 6,624,064 B1 | 9/2003 | Sahin et al. | |
| 6,630,413 B2 | 10/2003 | Todd | |
| 6,645,303 B2 | 11/2003 | Frankei et al. | |
| 6,656,804 B2 | 12/2003 | Tsujikawa et al. | |
| 6,660,391 B1 | 12/2003 | Rose et al. | |
| 6,667,553 B2 | 12/2003 | Cerny et al. | |
| 6,670,284 B2 | 12/2003 | Yin | |
| 6,676,751 B2 | 1/2004 | Solomon et al. | |
| 6,682,659 B1 | 1/2004 | Cho et al. | |
| 6,682,969 B1 | 1/2004 | Basceri et al. | |
| 6,683,364 B2 | 1/2004 | Oh et al. | |
| 6,706,634 B1 * | 3/2004 | Seitz et al. | 438/692 |
| 6,716,770 B2 | 4/2004 | O'Neill et al. | |
| 6,756,085 B2 | 6/2004 | Waldfried et al. | |
| 6,762,126 B2 | 7/2004 | Cho et al. | |
| 6,787,191 B2 | 9/2004 | Hanahata et al. | |
| 6,794,290 B1 | 9/2004 | Papasouliotis et al. | |
| 6,800,571 B2 | 10/2004 | Cheung et al. | |
| 6,818,517 B1 | 11/2004 | Maes | |
| 6,819,886 B2 | 11/2004 | Runkowske et al. | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,835,278 B2 | 12/2004 | Selbrede et al. | |
| 6,849,520 B2 | 2/2005 | Kim et al. | |
| 6,858,523 B2 | 2/2005 | Deboer et al. | |
| 6,858,533 B2 | 2/2005 | Chu et al. | |
| 6,867,086 B1 | 3/2005 | Chen et al. | |
| 6,872,323 B1 | 3/2005 | Entley et al. | |
| 6,890,403 B2 | 5/2005 | Cheung | |
| 6,900,067 B2 | 5/2005 | Kobayashi et al. | |
| 6,955,836 B2 | 10/2005 | Kumagai et al. | |
| 6,958,112 B2 | 10/2005 | Karim et al. | |
| 7,018,902 B2 | 3/2006 | Visokay et al. | |
| 7,077,904 B2 | 7/2006 | Cho et al. | |
| 7,084,076 B2 | 8/2006 | Park et al. | |
| 7,087,497 B2 | 8/2006 | Yuan et al. | |
| 7,109,114 B2 | 9/2006 | Chen et al. | |
| 7,115,419 B2 | 10/2006 | Suzuki | |
| 7,122,222 B2 | 10/2006 | Xiao et al. | |
| 7,129,185 B2 | 10/2006 | Aoyama et al. | |
| 7,148,155 B1 | 12/2006 | Tarafdar et al. | |
| 7,176,144 B1 | 2/2007 | Wang et al. | |
| 7,183,177 B2 | 2/2007 | Al-Bayati et al. | |
| 7,192,626 B2 | 3/2007 | Dussarrat et al. | |
| 7,205,248 B2 | 4/2007 | Li et al. | |
| 7,220,461 B2 | 5/2007 | Hasebe et al. | |
| 7,297,608 B1 | 11/2007 | Papasouliotis et al. | |
| 7,335,609 B2 | 2/2008 | Ingle et al. | |
| 7,399,388 B2 | 7/2008 | Moghadam et al. | |
| 7,419,903 B2 | 9/2008 | Haukka et al. | |
| 7,435,661 B2 | 10/2008 | Miller et al. | |
| 7,456,116 B2 | 11/2008 | Ingle et al. | |
| 7,498,273 B2 | 3/2009 | Mallick et al. | |
| 7,521,378 B2 | 4/2009 | Fucsko et al. | |
| 7,524,735 B1 | 4/2009 | Gauri et al. | |
| 7,524,750 B2 | 4/2009 | Nemani et al. | |
| 7,541,297 B2 | 6/2009 | Mallick et al. | |
| 7,745,352 B2 | 6/2010 | Mallick et al. | |
| 7,749,574 B2 | 7/2010 | Mahajani et al. | |
| 7,790,634 B2 | 9/2010 | Munro et al. | |
| 7,803,722 B2 | 9/2010 | Liang | |
| 7,825,038 B2 | 11/2010 | Ingle et al. | |
| 7,825,044 B2 | 11/2010 | Mallick et al. | |
| 7,867,923 B2 | 1/2011 | Mallick et al. | |
| 7,902,080 B2 | 3/2011 | Chen et al. | |
| 7,935,643 B2 | 5/2011 | Liang et al. | |
| 7,943,531 B2 | 5/2011 | Nemani et al. | |
| 7,989,365 B2 | 8/2011 | Park et al. | |
| 7,994,019 B1 | 8/2011 | Kweskin et al. | |
| 8,129,555 B2 | 3/2012 | Cheng et al. | |
| 8,232,176 B2 | 7/2012 | Lubomirsky et al. | |
| 8,236,708 B2 | 8/2012 | Kweskin et al. | |
| 8,242,031 B2 | 8/2012 | Mallick et al. | |
| 8,304,351 B2 | 11/2012 | Wang et al. | |
| 8,318,584 B2 | 11/2012 | Li et al. | |
| 2001/0021595 A1 | 9/2001 | Jang et al. | |
| 2001/0029114 A1 | 10/2001 | Vulpio et al. | |
| 2001/0038919 A1 | 11/2001 | Berry et al. | |
| 2001/0042511 A1 | 11/2001 | Liu et al. | |
| 2001/0048980 A1 * | 12/2001 | Kishimoto et al. | 427/569 |
| 2001/0054387 A1 | 12/2001 | Frankel et al. | |
| 2001/0055889 A1 | 12/2001 | Iyer | |
| 2002/0048969 A1 | 4/2002 | Suzuki et al. | |
| 2002/0068416 A1 | 6/2002 | Hsieh et al. | |
| 2002/0068466 A1 | 6/2002 | Lee et al. | |

| Publication No. | Date | Inventor | | Publication No. | Date | Inventor |
|---|---|---|---|---|---|---|
| 2002/0079523 A1 | 6/2002 | Zheng et al. | | 2006/0068599 A1 | 3/2006 | Baek et al. |
| 2002/0081817 A1 | 6/2002 | Bhakta et al. | | 2006/0075966 A1 | 4/2006 | Chen et al. |
| 2002/0086166 A1 | 7/2002 | Hendricks et al. | | 2006/0088985 A1 | 4/2006 | Haverkort et al. |
| 2002/0127350 A1 | 9/2002 | Ishikawa et al. | | 2006/0090694 A1 | 5/2006 | Cho et al. |
| 2002/0129769 A1 | 9/2002 | Kim et al. | | 2006/0091104 A1 | 5/2006 | Takeshita et al. |
| 2002/0142585 A1 | 10/2002 | Mandal | | 2006/0096540 A1 | 5/2006 | Choi |
| 2002/0146879 A1 | 10/2002 | Fu et al. | | 2006/0102977 A1 | 5/2006 | Fucsko et al. |
| 2002/0164429 A1 | 11/2002 | Gaillard et al. | | 2006/0110939 A1 | 5/2006 | Joshi et al. |
| 2002/0164891 A1 | 11/2002 | Gates et al. | | 2006/0110943 A1 | 5/2006 | Swerts et al. |
| 2002/0177298 A1 | 11/2002 | Konishi et al. | | 2006/0121394 A1 | 6/2006 | Chi |
| 2002/0182893 A1 | 12/2002 | Ballantine et al. | | 2006/0159847 A1 | 7/2006 | Porter et al. |
| 2003/0001201 A1 | 1/2003 | Yuzuriha et al. | | 2006/0162661 A1 | 7/2006 | Jung et al. |
| 2003/0023113 A1 | 1/2003 | Druzkowski et al. | | 2006/0178018 A1 | 8/2006 | Olsen |
| 2003/0040199 A1 | 2/2003 | Agarwal | | 2006/0223315 A1 | 10/2006 | Yokota et al. |
| 2003/0064154 A1 | 4/2003 | Laxman et al. | | 2006/0228903 A1 | 10/2006 | McSwiney et al. |
| 2003/0077918 A1 | 4/2003 | Wu et al. | | 2006/0252240 A1 | 11/2006 | Gschwandtner et al. |
| 2003/0113992 A1 | 6/2003 | Yau et al. | | 2006/0281496 A1 | 12/2006 | Cedraeus |
| 2003/0118748 A1 | 6/2003 | Kumagai et al. | | 2006/0286774 A1 | 12/2006 | Singh et al. |
| 2003/0124873 A1 | 7/2003 | Xing et al. | | 2006/0286776 A1 | 12/2006 | Ranish et al. |
| 2003/0143841 A1 | 7/2003 | Yang et al. | | 2007/0004170 A1 | 1/2007 | Kawasaki et al. |
| 2003/0159656 A1 | 8/2003 | Tan et al. | | 2007/0020392 A1 | 1/2007 | Kobrin et al. |
| 2003/0172872 A1 | 9/2003 | Thakur et al. | | 2007/0026689 A1 | 2/2007 | Nakata et al. |
| 2003/0194881 A1 | 10/2003 | Totsuka et al. | | 2007/0031598 A1 | 2/2007 | Okuyama et al. |
| 2003/0199151 A1 | 10/2003 | Ho et al. | | 2007/0031609 A1 | 2/2007 | Kumar et al. |
| 2003/0232495 A1 | 12/2003 | Moghadam et al. | | 2007/0032054 A1 * | 2/2007 | Ramaswamy et al. ......... 438/513 |
| 2004/0008334 A1 | 1/2004 | Sreenivasan et al. | | 2007/0049044 A1 | 3/2007 | Marsh |
| 2004/0020601 A1 | 2/2004 | Zhao et al. | | 2007/0066022 A1 | 3/2007 | Chen et al. |
| 2004/0029352 A1 | 2/2004 | Beyer et al. | | 2007/0077777 A1 | 4/2007 | Gumpher |
| 2004/0029353 A1 | 2/2004 | Zheng et al. | | 2007/0092661 A1 | 4/2007 | Ryuzaki et al. |
| 2004/0048492 A1 | 3/2004 | Ishikawa et al. | | 2007/0099438 A1 | 5/2007 | Ye et al. |
| 2004/0065253 A1 | 4/2004 | Pois et al. | | 2007/0108404 A1 | 5/2007 | Stewart et al. |
| 2004/0079118 A1 | 4/2004 | M'Saad et al. | | 2007/0128864 A1 | 6/2007 | Ma et al. |
| 2004/0082131 A1 | 4/2004 | Tsujikawa et al. | | 2007/0134433 A1 | 6/2007 | Dussarrat et al. |
| 2004/0110354 A1 | 6/2004 | Natzle et al. | | 2007/0166892 A1 | 7/2007 | Hori |
| 2004/0139983 A1 | 7/2004 | Lakshmanan et al. | | 2007/0173073 A1 | 7/2007 | Weber |
| 2004/0146661 A1 | 7/2004 | Kapoor et al. | | 2007/0181966 A1 | 8/2007 | Watatani et al. |
| 2004/0152342 A1 | 8/2004 | Li et al. | | 2007/0232071 A1 | 10/2007 | Balseanu et al. |
| 2004/0161899 A1 | 8/2004 | Luo et al. | | 2007/0232082 A1 | 10/2007 | Balseanu et al. |
| 2004/0166680 A1 | 8/2004 | Miyajima et al. | | 2007/0275569 A1 | 11/2007 | Moghadam et al. |
| 2004/0175501 A1 | 9/2004 | Lukas et al. | | 2007/0281106 A1 | 12/2007 | Lubomirsky et al. |
| 2004/0180557 A1 | 9/2004 | Park et al. | | 2007/0281448 A1 | 12/2007 | Chen et al. |
| 2004/0185641 A1 | 9/2004 | Tanabe et al. | | 2007/0281495 A1 | 12/2007 | Mallick et al. |
| 2004/0194706 A1 | 10/2004 | Wang et al. | | 2007/0281496 A1 | 12/2007 | Ingle et al. |
| 2004/0197843 A1 | 10/2004 | Chou et al. | | 2007/0289534 A1 | 12/2007 | Lubomirsky et al. |
| 2004/0216844 A1 | 11/2004 | Janakiraman et al. | | 2007/0298585 A1 | 12/2007 | Lubomirsky et al. |
| 2004/0219780 A1 | 11/2004 | Ohuchi | | 2008/0000423 A1 | 1/2008 | Fukiage |
| 2004/0231590 A1 | 11/2004 | Ovshinksy | | 2008/0014759 A1 | 1/2008 | Chua et al. |
| 2004/0241342 A1 | 12/2004 | Karim et al. | | 2008/0026597 A1 | 1/2008 | Munro et al. |
| 2005/0001556 A1 | 1/2005 | Hoffman et al. | | 2008/0038486 A1 | 2/2008 | Treichel et al. |
| 2005/0014354 A1 | 1/2005 | Ozawa et al. | | 2008/0063809 A1 | 3/2008 | Lee et al. |
| 2005/0019494 A1 | 1/2005 | Moghadam et al. | | 2008/0081104 A1 | 4/2008 | Hasebe et al. |
| 2005/0026443 A1 | 2/2005 | Goo et al. | | 2008/0085607 A1 | 4/2008 | Yu et al. |
| 2005/0062165 A1 | 3/2005 | Saenger et al. | | 2008/0102223 A1 | 5/2008 | Wagner et al. |
| 2005/0087140 A1 | 4/2005 | Yuda et al. | | 2008/0102650 A1 | 5/2008 | Adams et al. |
| 2005/0118794 A1 | 6/2005 | Babayan et al. | | 2008/0182382 A1 | 7/2008 | Ingle et al. |
| 2005/0121145 A1 | 6/2005 | Du Bois et al. | | 2008/0188087 A1 | 8/2008 | Chen et al. |
| 2005/0142895 A1 | 6/2005 | Ingle et al. | | 2008/0206954 A1 | 8/2008 | Chen et al. |
| 2005/0153574 A1 | 7/2005 | Mandal | | 2008/0241358 A1 | 10/2008 | Joe et al. |
| 2005/0181555 A1 | 8/2005 | Haukka et al. | | 2008/0260969 A1 | 10/2008 | Dussarrat et al. |
| 2005/0186731 A1 | 8/2005 | Derderian et al. | | 2008/0305648 A1 | 12/2008 | Fukazawa et al. |
| 2005/0186789 A1 | 8/2005 | Agarwal | | 2008/0318429 A1 | 12/2008 | Ozawa et al. |
| 2005/0196533 A1 | 9/2005 | Hasebe et al. | | 2009/0031953 A1 | 2/2009 | Ingle et al. |
| 2005/0196935 A1 | 9/2005 | Ishitsuka et al. | | 2009/0035917 A1 | 2/2009 | Ahn et al. |
| 2005/0196977 A1 | 9/2005 | Saito et al. | | 2009/0053901 A1 | 2/2009 | Goto et al. |
| 2005/0224866 A1 | 10/2005 | Higashi et al. | | 2009/0061647 A1 | 3/2009 | Mallick et al. |
| 2005/0227017 A1 | 10/2005 | Senzaki et al. | | 2009/0075490 A1 | 3/2009 | Dussarrat et al. |
| 2005/0227499 A1 | 10/2005 | Park et al. | | 2009/0095714 A1 | 4/2009 | Chen et al. |
| 2005/0230350 A1 | 10/2005 | Kao et al. | | 2009/0104755 A1 | 4/2009 | Mallick et al. |
| 2005/0233595 A1 | 10/2005 | Choi et al. | | 2009/0104789 A1 | 4/2009 | Mallick et al. |
| 2005/0250340 A1 | 11/2005 | Chen et al. | | 2009/0104790 A1 | 4/2009 | Liang |
| 2005/0257890 A1 | 11/2005 | Park et al. | | 2009/0104791 A1 | 4/2009 | Nemani et al. |
| 2005/0260347 A1 | 11/2005 | Narwankar et al. | | 2009/0104798 A1 | 4/2009 | Hirano |
| 2006/0011984 A1 | 1/2006 | Curie | | 2009/0142935 A1 | 6/2009 | Fukazawa et al. |
| 2006/0014399 A1 | 1/2006 | Joe | | 2009/0194809 A1 | 8/2009 | Cho |
| 2006/0030151 A1 | 2/2006 | Ding et al. | | 2009/0203225 A1 | 8/2009 | Gates et al. |
| 2006/0030165 A1 | 2/2006 | Ingle et al. | | 2009/0209081 A1 | 8/2009 | Matero et al. |
| 2006/0046427 A1 | 3/2006 | Ingle et al. | | 2009/0215251 A1 * | 8/2009 | Vellaikal et al. ............. 438/513 |
| 2006/0046506 A1 | 3/2006 | Fukiage | | 2009/0224374 A1 | 9/2009 | Bhatia et al. |
| 2006/0055004 A1 | 3/2006 | Gates et al. | | 2009/0232985 A1 | 9/2009 | Dussarrat et al. |

| | | | |
|---|---|---|---|
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0081293 A1 | 4/2010 | Mallick et al. |
| 2010/0140756 A1 | 6/2010 | Kozasa et al. |
| 2010/0143609 A1 | 6/2010 | Fukazawa et al. |
| 2010/0221428 A1 | 9/2010 | Dussarrat |
| 2010/0221925 A1 | 9/2010 | Lee et al. |
| 2010/0255655 A1 | 10/2010 | Mallick et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0079982 A1 | 4/2012 | Lubomirsky et al. |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |
| 2012/0142192 A1 | 6/2012 | Li et al. |
| 2012/0145079 A1 | 6/2012 | Lubomirsky et al. |
| 2012/0177846 A1 | 7/2012 | Li et al. |
| 2012/0213940 A1 | 8/2012 | Mallick |
| 2012/0225565 A1 | 9/2012 | Bhatia et al. |
| 2012/0238108 A1 | 9/2012 | Chen et al. |
| 2012/0269989 A1 | 10/2012 | Liang et al. |
| 2012/0309205 A1 | 12/2012 | Wang et al. |

FOREIGN PATENT DOCUMENTS

| | | |
|---|---|---|
| EP | 1095958 B1 | 5/2001 |
| EP | 1717848 A | 11/2006 |
| JP | 61-234534 A | 10/1986 |
| JP | 64-048425 A | 2/1989 |
| JP | 1-198033 A | 8/1989 |
| JP | 01-235259 A | 9/1989 |
| JP | 01241826 A | 9/1989 |
| JP | 03-197684 A | 8/1991 |
| JP | 03-286531 | 12/1991 |
| JP | 05-259156 | 10/1993 |
| JP | 05-304147 A | 11/1993 |
| JP | 06-077150 A | 3/1994 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-237785 A | 9/1997 |
| JP | 10-163183 A | 6/1998 |
| JP | 11-274285 A | 10/1999 |
| JP | 2001-148382 A | 5/2001 |
| JP | 2002-370059 A | 12/2002 |
| JP | 2004-327639 | 11/2004 |
| JP | 2005-142448 A | 6/2005 |
| JP | 2005-268396 A | 9/2005 |
| JP | 2005-302848 A | 10/2005 |
| JP | 2008-159824 A | 7/2008 |
| JP | 2008/218684 A | 9/2008 |
| JP | 2011-220127 A | 11/2011 |
| KR | 10-2004-0091978 A | 11/2004 |
| KR | 1020040104533 A | 12/2004 |
| KR | 10-2005-0003758 A | 1/2005 |
| KR | 10-2005-0094183 A | 9/2005 |
| KR | 1020060081350 A | 7/2006 |
| KR | 10-2009-0011765 A | 2/2009 |
| KR | 10-2009-0122860 A | 12/2009 |
| TW | 200514163 | 4/2005 |
| TW | 200707582 | 2/2007 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |
| WO | 2009/055340 A1 | 4/2009 |
| WO | 2012/145148 A2 | 10/2012 |

OTHER PUBLICATIONS

Aylett, B. J. et al., "Silicon-Nitrogen Compounds. Part VI. The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Coltrin, M.E., et al.. "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al "Deposition of silicon dioxide and silicon nitride by remote plasma enhanced chemical vapor deposition," Journal of Vacuum Science & Technology, vol. 4, No. 3, May-Jun. 1986, pp. 681-688.

Norman, Arlan D. et al., "Reaction of Silyiphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Ward, L. G. L. et al., "The Preparation and Properties of Bis-Disilanyl Sulphide and Tris-Disilanylamine,"J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, 1998, 5 pages, vol. 7, VCH Publishers, Inc., New York.

Franz, et al., "Conversion of silicon nitride into silicon dioxide through the influence of oxygen," Solid-State Electronics, Jun. 1971, pp. 449-505, vol. 14, Issue 6, Germany. Abstract Only.

International Search Report and Written Opinion of PCT/US2011/066275, mailed Sep. 24, 2012, 9 pages.

International Search Report and Written Opinion of PCT/US2012/031640 mailed Oct. 18, 2012, 10 pages.

Tripp, et al., "The Anodic Oxidation of Silicon Nitride Films on Silicon," Journal of the Electrochemical Society, 1970, pp. 157-159, 117(2).

Usenko, et al., "Silicon Nitride Surface Conversion into Oxide to Enable Hydrophilic Bonding," ECS Meeting Abstracts, 2010, 1 page, Abstract #1716, 218th ECS Meeting.

Alexandrov, Sergei E., et al., "Formation of Silicon Nitride Films by Remote Plasma-enhanced Chemical Vapour Deposition". Advanced Materials for Optics and Electronics, vol. 2, 301-312 (1993).

Bowen, C., et al., "New Processing Techniques: Sweeping of Quartz Wafers and A Practical Method for Processing Quartz Resonators Under Controlled Conditions," Proceedings of the 1992 IEEE Frequency Control Symposium, pp. 648-656.

International Search Report and Written Opinion of PCT/US2011/054635, mailed Jul. 9, 2012, 11 pages.

International Search Report and Written Opinion of PCT/US2011/054981, mailed May 9, 2012, 10 pages.

International Search Report and Written Opinion of PCT/US2011/054984, mailed May 11, 2012, 10 pages.

International Search Report and Written Opinion of PCT/US2011/066601, mailed Jul. 20, 2012, 10 pages.

Loboda, M.J., et al., "Chemical influence of inert gas on the thin film stress in plasma-enhanced chemical vapor deposited a- SiN:H films". Journal of Materials Research, vol. 11, No. 2, Feb. 1996, pp. 391-398.

* cited by examiner

POLYSILICON FILMS BY HDP-CVD

CROSS-REFERENCES TO RELATED APPLICATIONS

This application claims the benefit of U.S. Prov Pat. App. No. 61/435,487 filed Jan. 24, 2011, and titled "DEPOSITION OF POLYSILICON FILM BY HDP-CVD," which is entirely incorporated herein by reference for all purposes.

BACKGROUND OF THE INVENTION

Semiconductor device geometries have dramatically decreased in size since their introduction several decades ago. Modern semiconductor fabrication equipment routinely produces devices with 45 nm, 32 nm, and 28 nm feature sizes, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with material.

Polycrystalline silicon (often shortened to polysilicon) is a material which has multiple uses in the production of microcircuitry and solar cells. Polysilicon is deposited most commonly by thermal chemical vapor deposition (e.g. LP-CVD). It has also been deposited using plasma-enhanced CVD (i.e. PE-CVD) as well as formed through recrystallization of amorphous silicon. In many applications, polysilicon is doped and used as a gate or electrode. In other applications, polysilicon is used for portion(s) of transistors themselves, in which case they may be doped or intrinsic. The diversity of applications requires flexible methods for depositing polysilicon conformally as well as non-conformally.

New deposition methods are required which offer the flexibility to vary the conformality of the deposition of a polysilicon layer. These new methods should also enable deposition at reduced substrate temperatures in order to stay within increasingly stringent thermal budgets.

BRIEF SUMMARY OF THE INVENTION

Methods of forming polysilicon layers are described. The methods include forming a high-density plasma from a silicon precursor in a substrate processing region containing the deposition substrate. The described methods produce polycrystalline films at reduced substrate temperature (e.g. <500° C.) relative to prior art techniques. The availability of a bias plasma power adjustment further enables adjustment of conformality of the formed polysilicon layer. When dopants are included in the high density plasma, they may be incorporated into the polysilicon layer in such a way that they do not require a separate activation step.

Embodiments of the invention include methods of depositing a polysilicon layer in a trench of a patterned substrate in a substrate processing region of a substrate processing chamber. The methods include transferring the patterned substrate into the substrate processing region. The methods further include growing the polysilicon layer on the patterned substrate by forming a high density plasma in the substrate processing region from a deposition process gas comprising a silicon source while maintaining a mean pressure within the substrate processing region of about 20 mTorr or less and maintaining a mean patterned substrate temperature of 500° C. or less. The methods further include removing the patterned substrate from the substrate processing region.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION OF THE INVENTION

Figure 1:
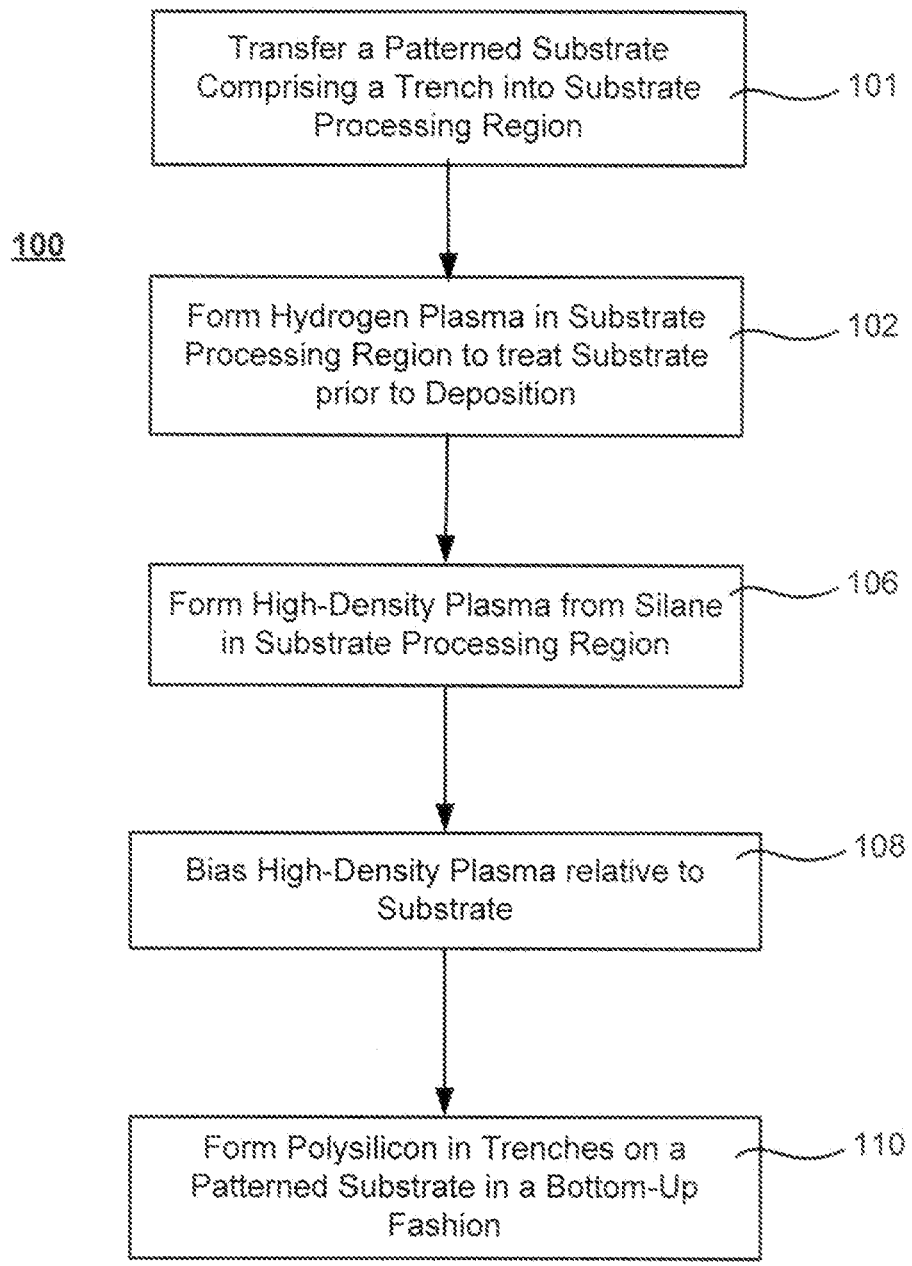
FIG. 1 is a flow chart indicating selected steps in growing a gapfill polysilicon film according to embodiments of the invention.

Methods of forming polysilicon layers are described. The methods include forming a high-density plasma from a silicon precursor in a substrate processing region containing the deposition substrate. The described methods produce polycrystalline films at reduced substrate temperature (e.g. <500° C.) relative to prior art techniques. The availability of a bias plasma power adjustment further enables adjustment of conformality of the formed polysilicon layer. When dopants are included in the high density plasma, they may be incorporated into the polysilicon layer in such a way that they do not require a separate activation step.

Depositing polysilicon on patterned substrate has been determined to be possible using high-density plasma techniques, with or without applied bias power. Stress typically associated with high-density plasma films has been found to be accommodated especially in systems with exposed silicon oxide on the patterned substrate. Conformal and bottom-up gapfill deposition regimes have both been determined and depend predominantly on the presence of a bias power and the polysilicon film growth rate. In both the conformal and bottom-up gapfill regimes, a hydrogen plasma treatment of the patterned substrate, prior to depositing the polysilicon, has been found to promote the growth of the polysilicon layer. The high density plasma chemical vapor deposition (HDP-CVD) technique may be used to enhance gap-fill as well as allowing deposition at the reduced substrate temperatures.

Conformal deposition of polysilicon has been found to occur at lower temperatures (e.g., <350° C.) using HDP CVD. Low deposition rates (e.g., <500 Å/min) and/or a high pressure (e.g., 10-30 m Torr) have also been found to produce conformal polysilicon films having side-wall (horizontal) and top (vertical) growth rates within about 50% of one another, in embodiments of the invention. HDP-CVD can also enable bottom up polysilicon deposition useful for filling gaps and trenches on a patterned substrate. The hydrogen pre-treatment of the exposed patterned substrate has been found to help produce dense polysilicon films with both column and/or grain-like structure. This may result from cleaning the exposed substrate and/or chemically terminating the exposed surfaces with hydrogen.

As used herein, a high-density-plasma process is a plasma CVD process that employs a plasma having an ion density on the order of $10^{11}$ ions/cm³ or greater. A high-density plasma may also have an ionization fraction (ion/neutral ratio) on the order of $10^{-4}$ or greater. Typically HDP-CVD processes include simultaneous deposition and sputtering components. Some HDP-CVD processes embodied in the present invention are different from traditional HDP-CVD processes which are typically optimized for gap-fill. In some steps and embodiments, conformal polycrystalline silicon films are achieved with substantially reduced (<10% of total plasma power) substrate bias power and thus create less sputtering than HDP-CVD processes that employ significant bias power. Despite this departure from traditional HDP process parameters, a scalar characterization involving sputtering and deposition rates will be useful and is defined below.

The relative levels of the combined deposition and sputtering characteristics of a high-density plasma may depend on such factors as the gas flow rates used to provide the gaseous mixture, the source power levels applied to maintain the plasma, the bias power applied to the substrate, and the like. A combination of these factors may be conveniently characterized by a "deposition-to-sputter ratio" defined as $$\frac{(\text{net deposition rate}) + (\text{blanket sputtering rate})}{(\text{blanket sputtering rate})}.$$

The deposition-to-sputter ratio increases with increased deposition and decreases with increased sputtering. As used in the definition of the deposition-to-sputter ratio, the "net deposition rate" refers to the deposition rate that is measured when deposition and sputtering are occurring simultaneously. The "blanket sputter rate" is the sputter rate measured when the process recipe is run without deposition gases (leaving nitrogen and a fluent for example). The flow rates of the remaining gases are increased, maintaining fixed ratios among them, to attain the pressure present in the process chamber during normal processing.

Other functionally equivalent measures may be used to quantify the relative deposition and sputtering contributions of the HDP process, as is known to those of skill in the art. A common alternative ratio is the "etching-to-deposition ratio"

$$\frac{(\text{source-only deposition rate}) + (\text{net deposition rate})}{(\text{source-only deposition rate})}$$

which increases with increased sputtering and decreases with increased deposition. As used in the definition of the etching-to-deposition ratio, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of deposition-to-sputter ratios. While deposition-to-sputter and etching-to-deposition ratios are not precise reciprocals, they are inversely related and conversion between them will be understood to those of skill in the art.

Typical HDP-CVD processes are geared towards the gapfill of trench geometries. In gapfill processes, a substrate bias RF power is used to accelerate ions toward the substrate which produces a narrow range of approach trajectories. This narrowing combined with sputtering activity allows gaps to be filled before the top corners of a growing via come together to form and maintain a void. Deposition-to-sputter ratios (D:S) in such gap fill applications may range from about 3:1 to about 10:1, for example, with some exotic applications having deposition-to-sputter ratios to about 25:1, for example. Silicon oxide films grown according to embodiments of the present invention may be produced with an HDP-CVD process using little or no substrate bias power. The blanket sputtering rate under these conditions may be low and the deposition-to-sputter ratio can generally be expected to be above about 50:1 to about 100:1 in different embodiments.

In order to better understand and appreciate the invention, reference is now made to FIG. 1 which is a flow chart indicating selected steps in growing a gapfill polysilicon film according to embodiments of the invention. The gapfill polysilicon formation process begins when a patterned substrate having a trench is transferred into a substrate processing region (operation 101). Hydrogen ($H_2$) is introduced into the substrate processing region and a high density plasma is formed (operation 102) to pretreat the surface of the patterned substrate before polysilicon is deposited. Next, silane is flowed to the substrate processing region and a high density plasma is formed (operation 106) to deposit polysilicon on the patterned substrate.

A plasma bias is applied between the high-density plasma and the substrate to accelerate ions toward the substrate in operation 108. As a result, gapfill polysilicon is formed in the trench in a bottom-up fashion. The substrate bias power may be adjusted to control the deposition-to-sputter ratio during the growth of the polysilicon gapfill layer. Exemplary deposition-to-sputter ratios may range from about 2:1 to about 6:1 during deposition. Allowing significant sputtering to occur during deposition reduces the chances for significant void formation in the deposited bulk-gap fill layer.

Figure 2:
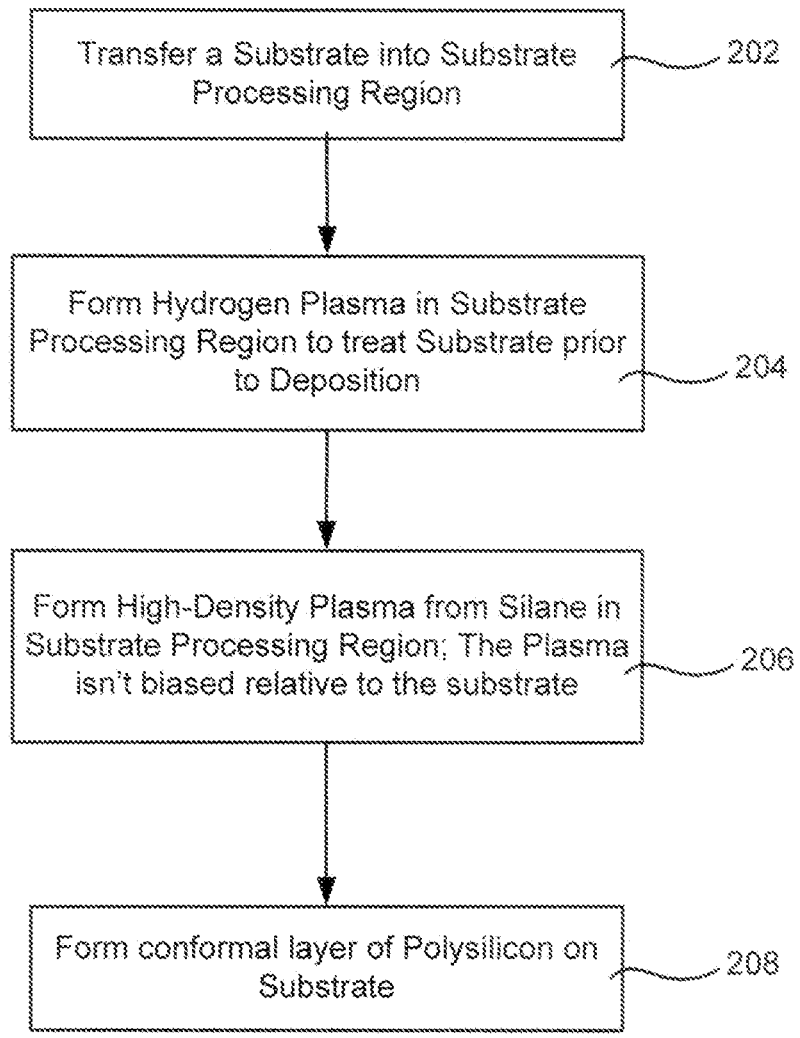
FIG. 2 is a flow chart indicating selected steps in growing a conformal polysilicon film according to embodiments of the invention.

FIG. 2 is a flow chart indicating selected steps in growing a conformal polysilicon film according to embodiments of the invention. The conformal polysilicon formation process begins when a substrate (patterned or unpatterned) is transferred into a substrate processing region (operation 202). Hydrogen ($H_2$) is introduced into the substrate processing region and a high density plasma is formed (operation 204) to pretreat the surface of the patterned substrate before polysilicon is deposited. Next, silane is flowed to the substrate processing region and an unbiased (or lightly-biased) high density plasma is formed (operation 206) to deposit polysilicon on the patterned substrate. Little or no plasma bias is applied between the high-density plasma and the substrate to accelerate ions toward the substrate. As a result, conformal polysilicon is formed on the substrate.

Forming either gapfill or conformal polysilicon according to the methods herein enables the process to be conducted at relatively low substrate temperatures. Whereas typical thermal polysilicon deposition processes may be carried out at substrate temperatures of 650° C. or more, the substrate temperatures used during formation of HDP polysilicon may be below or about 500° C., below or about 450° C. or below or about 400° C. in embodiments of the invention. The temperature of the substrate may be controlled in a variety of ways. In FIGS. 1-2 the substrate may be heated to the deposition temperature using the hydrogen plasma. In situations where the plasmas would raise the substrate temperature above these ranges, the back of the substrate may be cooled by a backside flow of helium. Growing polysilicon below about 300° C. has been found to grow a mixture of polysilicon and amorphous silicon.

Polysilicon layers formed using high density plasmas may possess compressive stress. Underlying silicon dioxide material (which is present on portions of the underlying substrate, in embodiments) may absorb some of the stress associated with the gapfill polysilicon layer.

Silane is not the only silicon source useful for forming polysilicon. Disilane and higher order silanes would also be able to form these films, as would silanes having one or more double bond between adjacent silicon atoms. Silanes used to form polysilicon are devoid of halogens, in embodiments of the invention, to avoid the incorporation of halogens in the forming film. In general, these silicon sources may be used alone or combined in any combination with one another and are referred to collectively as the deposition process gas. Substitutes for some or all hydrogen ($H_2$) are also available. It has been found that ammonia ($NH_3$) is a useful source of hydrogen (H) for the pre-deposition treatment operation. Hydrazine ($N_2H_4$) and other nitrogen-and-hydrogen-containing compounds are also expected to work as inputs to the pretreatment plasma. In general, these hydrogen sources may be used alone or combined in any combination with one another and referred to collectively as the pretreatment process gas.

Any of the process gases referred to herein may be combined with inert gases which may assist in stabilizing the high-density plasma or improving the uniformity of the polisyilicon deposition across a substrate. Argon, neon and/or helium are added to these process gases in embodiments of the invention and will be referred to as fluent gases. Fluent gases may be introduced during one or more of the steps to alter (e.g., increase) the plasma density. Increasing the plasma density may help to increase the ionization and dissociation probabilities within the plasma.

A source of dopants may also be included in the deposition process gas in order to incorporate dopants in some polysilicon films, in embodiments of the invention. The nature of the high-density plasma allows the dopants to bond more tightly within the polysilicon films which obviates the requirement for a separate thermal dopant activation step, in embodiments. A boron-containing precursor may be added to the deposition process gas (e.g. TEB, TMB, $BH_3$, $B_2H_6$, higher order boranes, . . . ) in order to put activated boron (B) doping centers in the forming polysilicon layer. Alternatively, activated phosphorus (P) doping centers may be included in the polysilicon layer, in embodiments, by adding a phosphorus-containing precursor (e.g. $PH_3$ . . . ) to the deposition process gas.

The source of dopants may also introduce dopants, such as carbon, which are valence isoelectronic with the primary atomic constituent (silicon), in embodiments of the invention. Carbon may be introduced by including a hydrocarbon in the source of dopants. Suitable hydrocarbons include $CH_4$, $C_2H_6$, $C_2H_4$, $C_2H_2$, $C_3H_8$, $C_3H_6$ and so on. The concentration of carbon in carbon-doped polysilicon films may be high, in excess of 10% or 20% in embodiments of the invention.

Exemplary Substrate Processing System

Figure 3A:
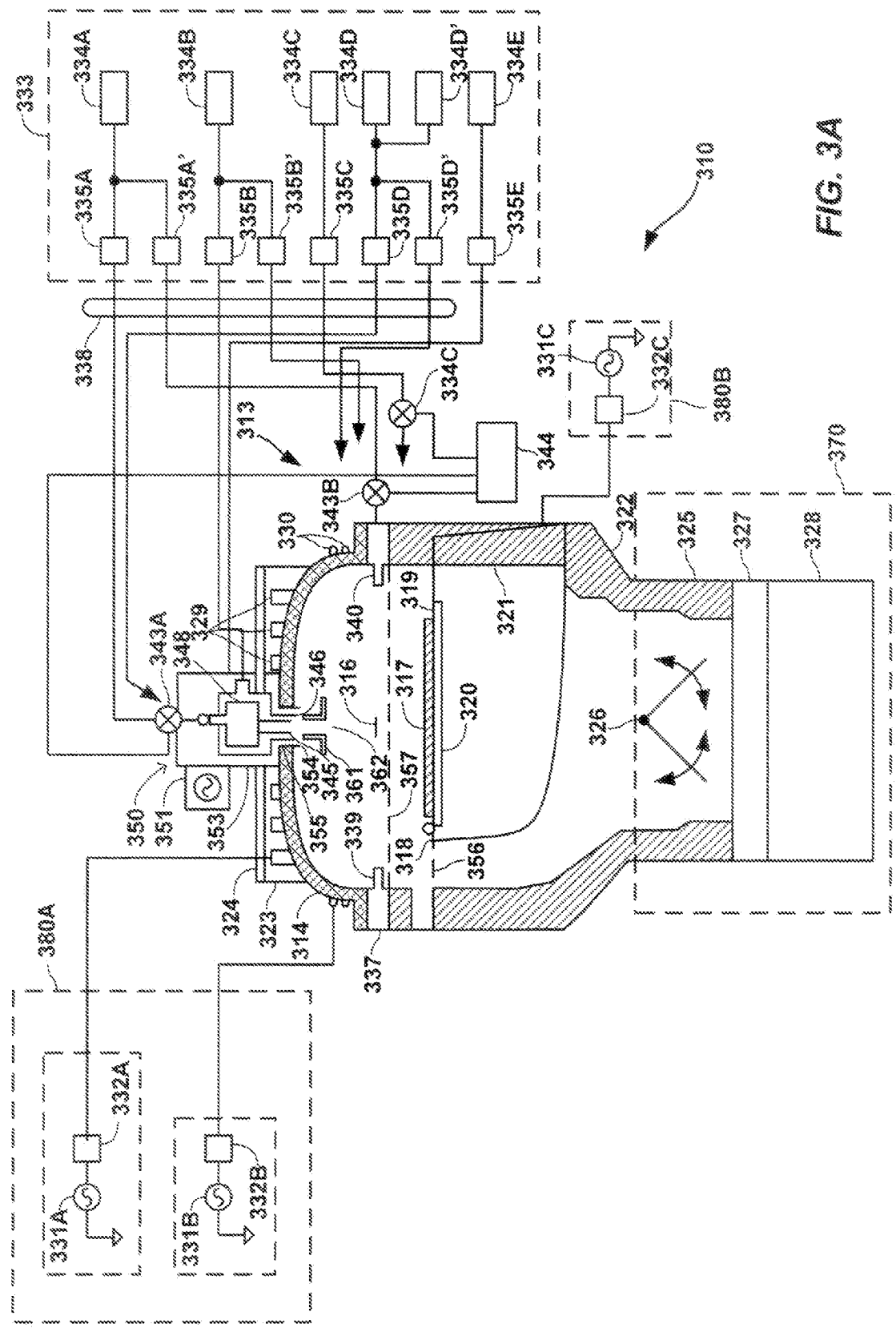
FIG. 3A is a simplified diagram of one embodiment of a high-density-plasma chemical-vapor-deposition system according to embodiments of the invention.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa. Tetsuya Ishikawa, Dan Maydan, Shijian Li, Brian Luc, Robert Steger, Yaxin Wang, Manus Wong and Ashok Sinha, the entire disclosure of which is incorporated herein by reference. An overview of the system is provided in connection with FIGS. 3A and 3B below. FIG. 3A schematically illustrates the structure of such an HDP-CVD system 310 in an embodiment. The system 310 includes a chamber 313, a vacuum system 370, a source plasma system 380A, a substrate bias plasma system 380B, a gas delivery system 333, and a remote plasma cleaning system 350.

The upper portion of chamber 313 includes a dome 314, which is made of a ceramic dielectric material, such as aluminum oxide or aluminum nitride. Dome 314 defines an upper boundary of a plasma processing region 316. Plasma processing region 316 is bounded on the bottom by the upper surface of a substrate 317 and a substrate support member 318.

A heater plate 323 and a cold plate 324 surmount, and are thermally coupled to, dome 314. Heater plate 323 and cold plate 324 allow control of the dome temperature to within about +10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 313 includes a body member 322, which joins the chamber to the vacuum system. A base portion 321 of substrate support member 318 is mounted on, and forms a continuous inner surface with, body member 322. Substrates are transferred into and out of chamber 313 by a robot blade (not shown) through an insertion/removal opening (not shown) in the side of chamber 313. Lift pins (not shown) are raised and then lowered under the control of a motor (also not shown) to move the substrate from the robot blade at an upper loading position 357 to a lower processing position 356 in which the substrate is placed on a substrate receiving portion 319 of substrate support member 318. Substrate receiving portion 319 includes an electrostatic chuck 320 that secures the substrate to substrate support member 318 during substrate processing. In a preferred embodiment, substrate support member 318 is made from an aluminum oxide or aluminum ceramic material.

Vacuum system 370 includes throttle body 325, which houses twin-blade throttle valve 326 and is attached to gate valve 327 and turbo-molecular pump 328. It should be noted that throttle body 325 offers minimum obstruction to gas flow, and allows symmetric pumping. Gate valve 327 can isolate pump 328 from throttle body 325, and can also control chamber pressure by restricting the exhaust flow capacity when throttle valve 326 is fully open. The arrangement of the throttle valve, gate valve, and turbo-molecular pump allow accurate and stable control of chamber pressures up to about 1 mTorr to about 2 Torr.

The source plasma system 380A includes a top coil 329 and side coil 330, mounted on dome 314. A symmetrical ground shield (not shown) reduces electrical coupling between the coils. Top coil 329 is powered by top source RF (SRF) generator 331A, whereas side coil 330 is powered by side SRF generator 331B, allowing independent power levels and frequencies of operation for each coil. This dual coil system allows control of the radial ion density in chamber 313, thereby improving plasma uniformity. Side coil 330 and top coil 329 are typically inductively driven, which does not require a complimentary electrode. In a specific embodiment, the top source RF generator 331A provides up to 5,000 watts of RF power at nominally 2 MHz and the side source RF generator 331B provides up to 7,500 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A substrate bias plasma system 380B includes a bias RF ("BRF") generator 331C and a bias matching network 332C. The bias plasma system 380B capacitively couples substrate portion 317 to body member 322, which act as complimentary electrodes. The bias plasma system 380B serves to enhance the transport of plasma species (e.g., ions) created by the source plasma system 380A to the surface of the substrate. In a specific embodiment, the substrate bias RF generator provides up to 10,000 watts of RF power at a frequency of about 13.56 MHz.

RF generators 331A and 331B include digitally controlled synthesizers. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 332A and 332B match the output impedance of generators 331A and 331B with their respective coils 329 and 330. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 3B:
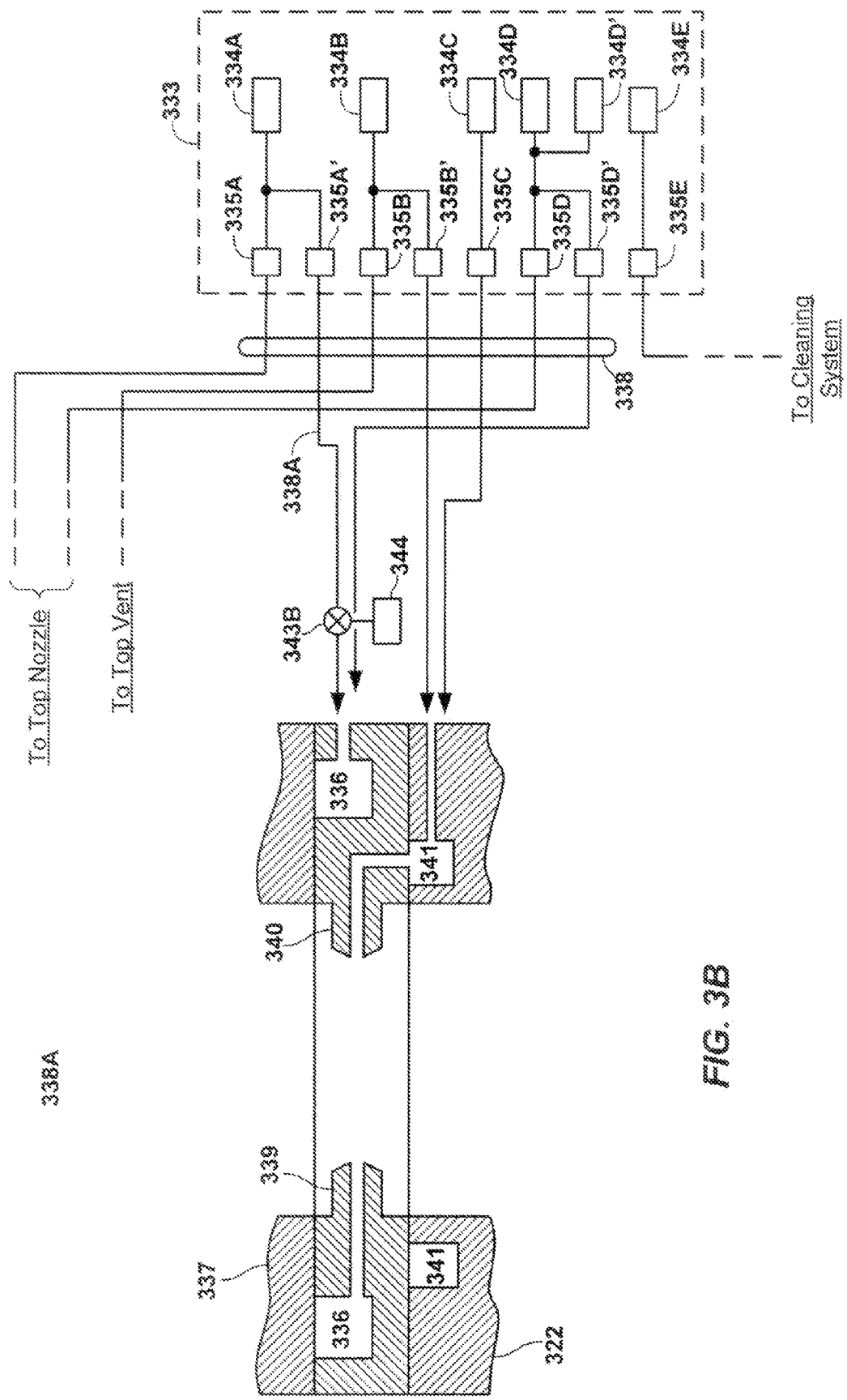
FIG. 3B is a simplified cross section of a gas ring that may be used in conjunction with the exemplary processing system of FIG. 3A.

A gas delivery system 333 provides gases from several sources, 334A-334E to a chamber for processing the substrate by way of gas delivery lines 338 (only some of which are shown). As would be understood by a person of skill in the art, the actual sources used for sources 334A-334E and the actual connection of delivery lines 338 to chamber 313 varies depending on the deposition and cleaning processes executed within chamber 313. Gases are introduced into chamber 313 through a gas ring 337 and/or a top nozzle 345. FIG. 3B is a simplified, partial cross-sectional view of chamber 313 showing additional details of gas ring 337.

In one embodiment, first and second gas sources, 334A and 334B, and first and second gas flow controllers, 335A' and 335B', provide gas to ring plenum 336 in gas ring 337 by way of gas delivery lines 338 (only some of which are shown). Gas ring 337 has a plurality of source gas nozzles 339 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. An a preferred embodiment, gas ring 337 has 12 source gas nozzles made from an aluminum oxide ceramic.

Gas ring 337 also has a plurality of oxidizer gas nozzles 340 (only one of which is shown), which in one embodiment are co-planar with and shorter than source gas nozzles 339, and in one embodiment receive gas from body plenum 341. In some embodiments it is desirable not to mix source gases and oxidizer gases before injecting the gases into chamber 313. In other embodiments, Oxidizer gas and source gas may be mixed prior to injecting the gases into chamber 313 by providing apertures (not shown) between body plenum 341 and gas ring plenum 336. In one embodiment, third, fourth, and fifth gas sources, 334C, 334D, and 334D', and third and fourth gas flow controllers, 335C and 335D', provide gas to body plenum by way of gas delivery lines 338. Additional valves, such as 343B (other valves not shown), may shut off gas from the flow controllers to the chamber. In implementing certain embodiments of the invention, source 334A comprises a silane $SiH_4$ source, source 334B comprises a molecular nitrogen $N_2$ source, source 334C comprises a TSA source, source 334D comprises an argon Ar source, and source 334D' comprises a disilane $Si_2H_6$ source.

In embodiments where flammable, toxic, or corrosive gases are used, it may be desirable to eliminate gas remaining in the gas delivery lines after a deposition. This may be accomplished using a 3-way valve, such as valve 343B, to isolate chamber 313 from delivery line 338A and to vent delivery line 338A to vacuum foreline 344, for example. As shown in FIG. 3A, other similar valves, such as 343A and 3430, may be incorporated on other gas delivery lines. Such three-way valves may be placed as close to chamber 313 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 3A, chamber 313 also has top nozzle 345 and top vent 346. Top nozzle 345 and top vent 346 allow independent control of top and side flows of the gases, which improves film uniformity and allows fine adjustment of the film's deposition and doping parameters. Top vent 346 is an annular opening around top nozzle 345. In one embodiment, first gas source 334A supplies source gas nozzles 339 and top nozzle 345. Source nozzle MFC 335A' controls the amount of gas delivered to source gas nozzles 339 and top nozzle MFC 335A controls the amount of gas delivered to top gas nozzle 345. Similarly, two MFCs 335B and 335B' may be used to control the flow of oxygen to both top vent 346 and oxidizer gas nozzles 340 from a single source of oxygen, such as source 33413. In some embodiments, oxygen is not supplied to the chamber from any side nozzles. The gases supplied to top nozzle 345 and top vent 346 may be kept separate prior to flowing the gases into chamber 313, or the gases may be mixed in top plenum 348 before they flow into chamber 313. Separate sources of the same gas may be used to supply various portions of the chamber.

A remote microwave-generated plasma cleaning system 350 is provided to periodically clean deposition residues from chamber components. The cleaning system includes a remote microwave generator 351 that creates a plasma from a cleaning gas source 334E (e.g., molecular fluorine, nitrogen trifluoride, other fluorocarbons or equivalents) in reactor cavity 353. The reactive species resulting from this plasma are conveyed to chamber 313 through cleaning gas feed port 354 by way of applicator tube 355. The materials used to contain the cleaning plasma (e.g., cavity 353 and applicator tube 355) must be resistant to attack by the plasma. The distance between reactor cavity 353 and feed port 354 should be kept as short as practical, since the concentration of desirable plasma species may decline with distance from reactor cavity 353. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 320, do not need to be covered with a dummy wafer or otherwise protected, as may be required with an in situ plasma cleaning process. In FIG. 3A, the plasma-cleaning system 350 is shown disposed above the chamber 313, although other positions may alternatively be used.

A baffle 361 may be provided proximate the top nozzle to direct flows of source gases supplied through the top nozzle into the chamber and to direct flows of remotely generated plasma. Source gases provided through top nozzle 345 are directed through a central passage 362 into the chamber, while remotely generated plasma species provided through the cleaning gas feed port 354 are directed to the sides of the chamber by the baffle 361.

Seasoning the interior of the substrate processing region has been found to improve many high-density plasma deposition processes. The formation of polysilicon is no exception. Seasoning involves the deposition of silicon oxide on the chamber interior before a deposition substrate is introduced into the substrate processing region. In embodiments, seasoning the interior of the substrate processing region comprises forming a high density plasma in the substrate processing region from a seasoning process gas comprising an oxygen source and a silicon source. The oxygen source may be diatomic oxygen ($O_2$) and the silicon source may be silane ($SiH_4$), though other precursors may also suffice.

Comparative tests are run to measure the amount of stress in polycrystalline silicon films deposited in gaps with and without a silicon dioxide liner layer. The bulk gap-fill polysilicon layers are deposited in gaps formed on 300 mm diameter substrate wafers placed in an Ultima HDP processing chamber made by Applied Materials, Inc. of Santa Clara, Calif. The substrate was maintained at 350° C. during HDP-CVD deposition and the total source plasma RF power applied can be 10.6 Watts/cm$^2$ (7500 Watts) excluding bias power. The lining layer is grown with a substrate bias power of about 5.0 Watts/cm$^2$ (3500 Watts). Bias power in the range 3.5-10.0 Watts/cm$^2$ (2500-7000 Watts over a 300 mm diameter wafer) was applied to the substrate during growth of the polycrystalline silicon of the bulk gap-fill layer. The thickness of the lining layer can be about 200 Å and 500 Å, respectively. The thickness of the bulk gap-fill layer can be about 2.0 µm.

Those of ordinary skill in the art will realize that processing parameters can vary for different procesing chambers and different processing conditions, and that different precursors can be used without departing from the spirit of the invention. Appropriate silicon containing precursors may include trisilylamine (TSA, $(SiH_3)_3N$) and disilane ($Si_2H_6$) in addition to silane. Other variations will also be apparent to persons of skill in the art. These equivalents and alternatives are intended to be included within the scope of the present invention. Therefore, the scope of this invention should not be limited to the embodiments described, but should instead be defined by the following claims.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low aspect ratio trench which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of depositing a polysilicon layer in a trench of a patterned substrate in a substrate processing region of a substrate processing, chamber, the method comprising:
   transferring the patterned substrate into the substrate processing region;
   growing the polysilicon layer on the patterned substrate by forming a high density plasma in the substrate processing region from a deposition process gas comprising a silicon source while maintaining a mean pressure within the substrate processing region of about 20 mTorr or less and maintaining a mean patterned substrate temperature of 500° C. or less,
   wherein the process gas further comprises a doping source which provides a dopant to the polysilicon layer during growth, wherein the dopant is already activated upon formation of the polysilicon layer;
   removing the patterned substrate from the substrate processing region.

2. The method of claim 1, further comprising pretreating the patterned substrate in a high density plasma in the substrate processing region from a pretreatment process gas comprising a hydrogen source before growing the polysilicon layer on the patterned substrate.

3. The method of claim 1, wherein essentially no bias is applied between the patterned substrate and the high density plasma while growing the polysilicon layer such that the polysilicon layer is essentially conformal.

4. The method of claim 3, wherein a growth rate of the polysilicon layer is below about 500 Å/minute.

5. The method of claim 3, wherein a horizontal growth rate of the polysilicon layer as measured on a wall of the trench is between about 50% and 100% of a vertical growth rate, on a surface around the opening of the trench.

6. The method of claim 1, wherein a plasma bias power is applied between the patterned substrate and the high density plasma while growing the polysilicon layer such that the trench fills with polysilicon.

7. The method of claim 1, wherein the silicon source is silane.

8. The method of claim 1, wherein the process gas further comprises a fluent gas selected from argon, neon, and helium flowed with a fourth flow rate during the growth of at least one of the two layers.

9. The method of claim 1, wherein the mean patterned substrate temperature is less than or about 400° C.

10. The method of claim 1, wherein the process gas further comprises a source of phosphorous or boron.

11. The method of claim 1, wherein the process gas comprises $PH_3$ flowed at a fourth gas flow rate.

12. The method of claim 1, wherein a deposition-to-sputter ratio during growth of the polysilicon layer is between about 2:1 and 6:1.

13. The method of claim 1, wherein the interior of the substrate processing region is seasoned with silicon oxide prior to the operation of transferring the patterned substrate into the substrate processing region.

14. The method of claim 13, wherein seasoning the interior of the substrate processing region comprises forming a high density plasma in the substrate processing region from a seasoning process gas comprising an oxygen source and a silicon source.

15. The method of claim 14, wherein the oxygen source is diatomic oxygen ($O_2$) and the silicon source is silane ($SiH_4$).

16. The method of claim 1, wherein the process gas further comprises a source of carbon and the polysilicon layer is a carbon-doped polysilicon layer.

* * * * *